United States Patent
Oh

(10) Patent No.: US 8,896,202 B2
(45) Date of Patent: *Nov. 25, 2014

(54) DISPLAY DEVICE

(75) Inventor: Joohyeon Oh, Seoul (KR)

(73) Assignee: LG Electronics Inc., Seoul (KR)

( * ) Notice: Subject to any disclaimer, the term of this patent is extended or adjusted under 35 U.S.C. 154(b) by 92 days.

This patent is subject to a terminal disclaimer.

(21) Appl. No.: 13/407,260

(22) Filed: Feb. 28, 2012

(65) Prior Publication Data

US 2013/0221840 A1 Aug. 29, 2013

(51) Int. Cl.
*H01J 1/62* (2006.01)

(52) U.S. Cl.
USPC ..................................... 313/511; 361/679.27

(58) Field of Classification Search
CPC ................................ H01J 1/62; H01J 2211/42
USPC ................................................. 313/495–512
See application file for complete search history.

(56) References Cited

U.S. PATENT DOCUMENTS

| | | | |
|---|---|---|---|
| 6,753,788 B1 * | 6/2004 | Munyon | 340/815.4 |
| 7,787,097 B2 | 8/2010 | Satoh | |
| 2003/0142469 A1 | 7/2003 | Ponx | |
| 2005/0017953 A1 | 1/2005 | Pekka | |
| 2006/0007368 A1 | 1/2006 | Slikkerveer et al. | |
| 2007/0097014 A1 | 5/2007 | Solomon et al. | |
| 2009/0021666 A1 | 1/2009 | Chen | |
| 2011/0007042 A1 * | 1/2011 | Miyaguchi | 345/204 |
| 2013/0033844 A1 * | 2/2013 | Ladouceur et al. | 361/807 |

FOREIGN PATENT DOCUMENTS

JP 2006-287982 A 10/2006

* cited by examiner

*Primary Examiner* — Elmito Breval
(74) *Attorney, Agent, or Firm* — Birch, Stewart, Kolasch & Birch, LLP

(57) ABSTRACT

A display device is disclosed. The display device comprises a flexible display screen and a body supporting the flexible display screen. The body comprises a first body comprising a sloping surface on a cross-section, a second body, and a third body comprising a sloping surface on a cross-section. The body comprises a first bending portion provided between the first body and the second body, and the sloping surface of the first body is attached to the second body by the rotation of the first body.

21 Claims, 24 Drawing Sheets

(a)

(b)

DISPLAY DEVICE

BACKGROUND

1. Field

This document relates to a display device, and more particularly, to a display device comprising a flexible display screen.

2. Related Art

With the recent development of materials, driving techniques, and processing techniques of display devices, display devices are becoming thinner, and research on flexible display devices is underway. As a flexible display device is formed of a flexible plastic substrate, the display device can be bent or folded into a desired shape.

Such a flexible display is realized on a thin substrate such as plastic, and is not damaged even though it is folded or rolled like paper. Currently, a flexible display is realized by employing an organic light emitting device or liquid crystal display device, which can be manufactured to have a thickness of 1 mm or less.

SUMMARY

The present invention has been made in an effort to provide a display device which comprises a sloping surface on a cross-section of a body supporting a flexible display screen, and minimizes the bending structure of the flexible display screen by means of the sloping surface.

One embodiment of the present invention is directed to provide a display device which divides a flexible display screen evenly when folded.

Another embodiment of the present invention is directed to provide a display device which divides a flexible display screen evenly when folded to have the same thickness.

Another embodiment of the present invention is directed to provide a display device which can be used for various uses according to folding methods.

According to an aspect of the present invention, there is provided a display device comprising: a body comprising a first body with a sloping surface on a cross-section, a second body, and a third body with a sloping surface on a cross-section, the first, third, and second bodies being sequentially connected to each other; and a flexible display screen supported by the first body, the second body, and the third body to form a continuous screen.

The body may comprise a first bending portion which is provided between the first body and the second body and allows the sloping surface of the first body to be attached to the second body by the rotation of the first body.

The body may further comprise a second bending portion which is provided between the second body and the third body and allows a sloping surface of the third body to be attached to a predetermined region of the first screen supported by the first body by the rotation of the third body when the sloping surface of the first body is attached to the second body.

The rotation direction of the first body and the third body may be a rotation direction that causes the flexible display screen to be exposed to the outside by rotation.

The predetermined region of the first screen attached to the sloping surface of the third body may comprise a predetermined region of the flexible display screen supported by the first body, and the predetermined region may be a region that causes the second body and the third body to be in parallel.

The flexible display screen may comprise: a first screen supported by the first body; a second screen supported by the second body; and a third screen supported by the third body.

The display device may further comprise a display controller for controlling the power supply of the first to third screens.

The display controller may power off the first screen if the first body is rotated to attach the sloping surface of the first body to a predetermined region of the second body.

The display controller may power off the third screen if the third body is rotated to attach the sloping surface of the third body to a predetermined region of the first screen.

The second body may comprise a predetermined magnetic region, and the sloping surface of the first body may be magnetically coupled and attached to a predetermined region of the second body.

The screen supported by the first body may comprise at least some bezel areas, and the predetermined magnetic region may be at least part of the bezel areas.

The first body, the second body, and the third body may have the same length.

The display device may further comprise a camera module provided in a bezel area of the screen supported by the third body.

The flexible display screen may be a flexible organic light emitting diode FOLED.

According to another aspect of the present invention, there is provided a display device comprising: a body with at least one bending portion; and a flexible display screen which is disposed on the front of the body, supported by the body, and longer than the body.

The body may comprise a sloping body which extends from both ends of the body to both edges of the flexible display screen.

When a first sloping body is rotated on a first bending portion and attached to a predetermined region of the body, a second sloping body may be rotated on a second bending portion and attached to a predetermined region of the flexible display screen.

According to another aspect of the present invention, there is provided a display device comprising: a body comprising first, second, and third bodies sequentially connected to each other; and a flexible display screen which comprises a first screen supported by the first body and provided with a sloping surface on a cross-section, a second screen supported by the second body, and a third screen supported by the third body and comprising a sloping surface on a cross-section, the first, second, and third screens forming a continuous screen.

The body may comprise a first bending portion which allows the sloping surface of the first screen to be attached to the second screen by the rotation of the first body.

BRIEF DESCRIPTION OF THE DRAWINGS

The implementation of this document will be described in detail with reference to the following drawings in which like numerals refer to like elements.

DETAILED DESCRIPTION

Figure 1:
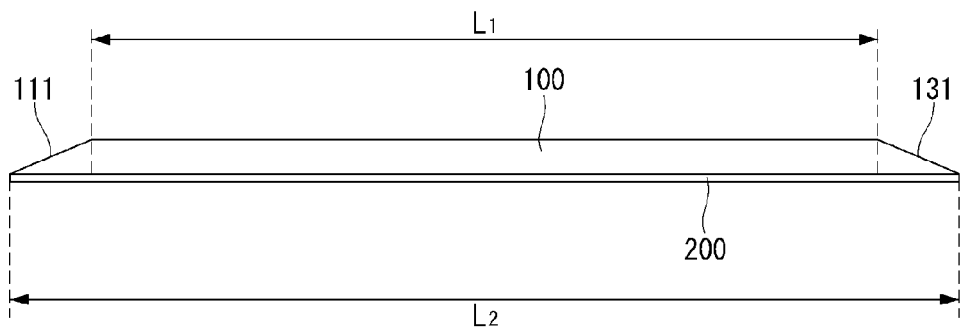
FIG. 1 is a view showing a schematic structure of a display device according to an embodiment of the present invention.

The above and other aspects, features and advantages of the present disclosure will be more apparent from the following detailed description taken in conjunction with the accompanying drawings. Hereinafter, an implementation of this document will be described in detail with reference to the attached drawings. Like reference numerals refer to like elements throughout the specification. In describing the present disclosure, detailed descriptions of well-known functions or configurations will be omitted in order to not necessarily obscure the subject matter of the present disclosure.

Hereinafter, a mobile terminal relating to this document will be described below in more detail with reference to the accompanying drawings. In the following description, suffixes "module" and "unit" are given to components of the mobile terminal in consideration of only facilitation of description and do not have meanings or functions discriminated from each other.

The mobile terminal described in the specification can include a cellular phone, a smart phone, a laptop computer, a digital broadcasting terminal, a personal digital assistant (PDA), a portable multimedia player (PMP), a navigation system, and so on.

FIG. 1 is a view showing a schematic structure of a display device according to an embodiment of the present invention.

Referring to FIG. 1, the display device according to an embodiment of the present invention may comprise a body 100 and a flexible display screen 200 supported by a body.

The body 100 may comprise sloping surfaces 111 and 131. The sloping surfaces 111 and 131 may be formed at both edges of the body 100.

Accordingly, the length of the body 100 may be L1, and the length of the flexible display screen 200 may be L2 which is greater than the length L1 of the body 100.

The body 100 may comprise a first sloping body 111 and a second sloping body 131 which extend from both edges of the body 100 to both edges of the flexible display screen 200.

The body 100, the first sloping body 111, and the second sloping body 131 may comprise logically separated regions or physically separated regions in a housing.

The flexible display screen 200 may be bent together with the body 100, supported by the body 100, as the body 100 is bent in a predetermined direction.

The display device according to an embodiment of the present invention may be rotated and bent at a predetermined region of the body 100. The body 100 may be divided into a plurality of bodies, and a bending portion may be formed between each of the divided bodies. The predetermined region may correspond to the bending portion.

Figure 2:
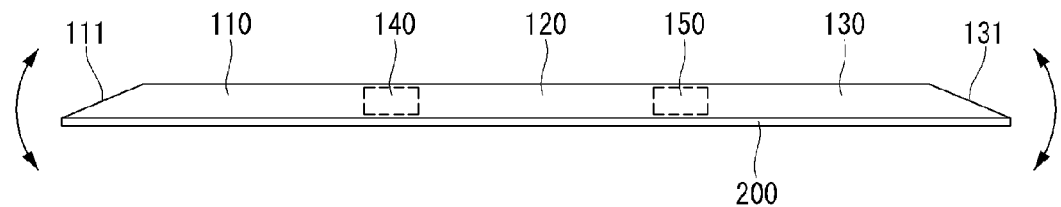
FIG. 2 is a view for explaining in more detail the display device shown in FIG. 1.

FIG. 2 is a view for explaining in more detail the display device shown in FIG. 1.

Referring to FIG. 2, in the display device according to an embodiment of the present invention, the body may comprise a first body 110, a second body 120, and a third body 130. The first body 110, the second body 120, and the third body 130 may be sequentially connected to each other.

A first bending portion 140 may be provided between the first body 110 and the second body 120, and a second bending portion 150 may be provided between the second body 129 and the third body 130.

Moreover, the flexible display screen 200 may be supported by the first body 110, the second body 120, and the third body 130 to form a continuous screen.

The first bending portion 140 and the second bending portion 150 may be made of the same material as the first to third bodies 110 to 130. As the flexible touch screen 200 is bent, the first to third bodies 110, 120, and 130 also may be made of a flexible material.

Moreover, the first bending portion 140 and the second bending portion 150 may be made of an elastic material. After the first body 110 and/or third body 130 are bent in their respective predetermined directions, if they are applied with a predetermined force, they may return to their original positions by the first bending portion 140 and the second bending portion 150.

As described above, the schematic configuration of the display device according to an embodiment of the present invention will be described with reference to FIGS. 1 and 2.

In what follows, an example of forming an integrated full body screen as the display device according to an embodiment of the present invention is bent will be described.

FIGS. 3 to 6 are views for explaining a procedure of folding the display device according to an embodiment of the present invention.

Figure 3:
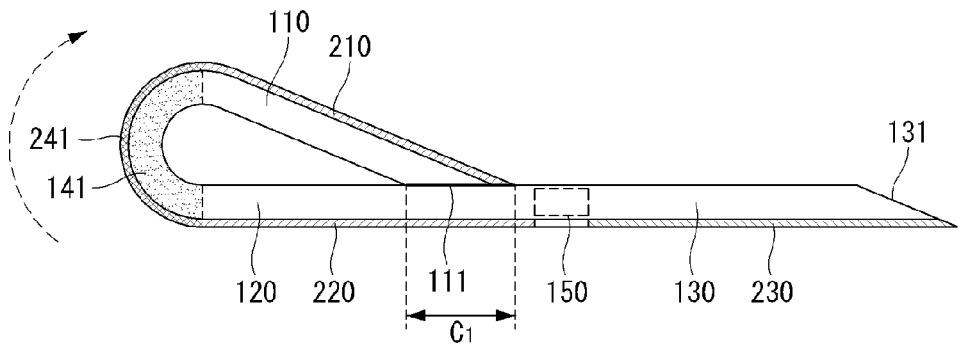
FIGS. 3 to 6 are views for explaining a procedure of folding the display device according to an embodiment of the present invention.
Figure 4:
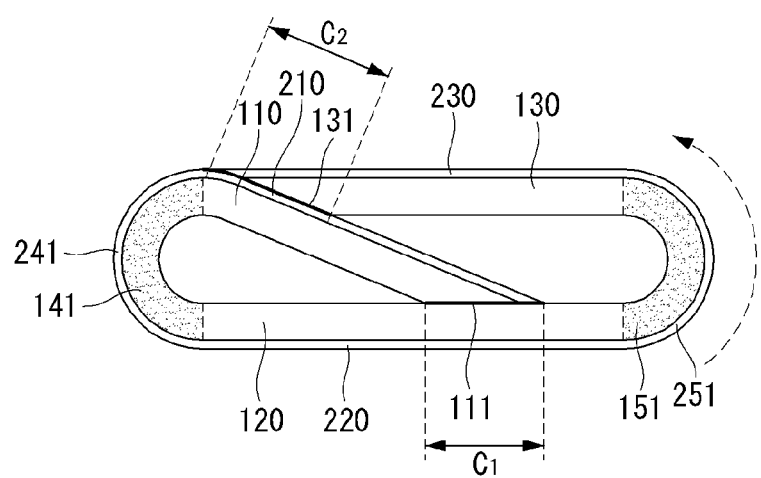

FIG. 3 shows an example in which the first body 110 is folded at the bending portion 141, and FIG. 4 shows the third body 130 being folded at the second bending portion 151 when the first body 110 is in a folded state.

Referring to FIG. 3, the flexible display screen 200 may comprise a first screen 210, a second screen 220, and a third screen 230.

The first screen 210 may be supported by the first body 110, the second screen 220 may be supported by the second body 120, and the third screen 230 may be supported by the third body 130. That is, the flexible display screen 200 is disposed on a side surface (e.g., front surface) of the body 100 to form a continuous screen.

As the first body 110 is rotated clockwise on the first bending portion 141, the sloping surface 111 formed on a cross-section of the body 110 is attached to a predetermined region C1 of the second body 120.

The sloping surface 111 of the first body 110 and the predetermined region C1 of the second body 120 may be magnetically attracted to each other. That is, the sloping surface 111 of the first body 110 and the predetermined region C1 of the second body 120 have the opposite polarity. Magnetic coupling caused by the rotation of a specific body will be described in more detail with reference to FIGS. 14 to 16.

If the angle of clockwise rotation of the first body 110 by the elastic force of the first bending portion 141 exceeds a predetermined critical angle, the elastic force of the first bending portion 141 and the magnetic attraction between the sloping surface 111 and the predetermined region C1 of the second body 120 cause the sloping surface 111 to be attached to the predetermined region C1 of the second body 120.

By the way, when the sloping surface 111 is attached to the predetermined region C1 of the second body 120, the first body 110 and the second body 120 are not attached to each other. That is, the first bending portion 141 has a predetermined elastic force but maintains a predetermined shape by the rotation of the first body 110. Accordingly, a space exists between the first body 110 and the second body 120.

The position of the predetermined region C1 of the second body 120 to which the sloping surface 111 is attached may be the position which causes the second body 120 and the third body 130 to be in parallel when the third body 130 is rotated counterclockwise and is attached to a predetermined region (C2 of FIG. 4) of the first screen 210 supported by the first body 110.

Referring to FIG. 4, after the sloping surface 111 of the first body 110 is attached to the predetermined region C1 of the second body 120, the third body 130 may be rotated counterclockwise and be coupled to the first body 110.

More specifically, the sloping surface 131 of the third body 130 may be rotated counterclockwise on the second bending portion 151, and be attached to the predetermined region C2 of the first screen 210 supported by the first body 110.

Similarly in FIG. 3, the sloping surface 131 of the third body 130 and the predetermined region C2 of the first screen 210 may be magnetically attracted to each other.

As stated above, the position of the predetermined region C2 of the first screen 210 to which the sloping surface 131 of the third body 130 is attached may be the position which causes the third body 130 to be kept in parallel with the second body 120 when the third body 130 is rotated counterclockwise on the second bending portion 151.

In FIGS. 3 to 4, the sloping surface 111 of the first body 1110 may comprise a sloping surface region of the first body and a sloping surface region of the first screen 210, and the sloping surface 131 of the third body 130 may comprise a sloping surface region of the third body 130 and a sloping surface region of the third screen 230.

Accordingly, due to the rotation of the first body 110, both the sloping surface region of the first body 110 and the sloping surface region of the first screen 210 are magnetically attracted to the predetermined region c1 of the second body. Moreover, due to the rotation of the third body 130, both the sloping surface region of the third body 130 and the sloping surface region of the third screen 230 are magnetically attracted to the predetermined region c2 of the first screen 210.

Moreover, referring to FIGS. 3 and 4, the first bending portion 141 and the second bending portion 151 may maintain a predetermined shape so that the display device according to an embodiment of the present invention is provided with a full body screen by the rotation of the first body 110 and the third body 130.

Although FIGS. 3 and 4 illustrate the procedure of forming a full body screen in such a manner that the third body 130 is folded when the first body 110 is already in a folded state, the full body screen can be formed regardless of the folding order of the first body 110 and the third body 130.

That is, owing to the symmetrical structure, the same full body screen can be formed regardless of the folding order of the first body 110 and the third body 130.

Figure 5:
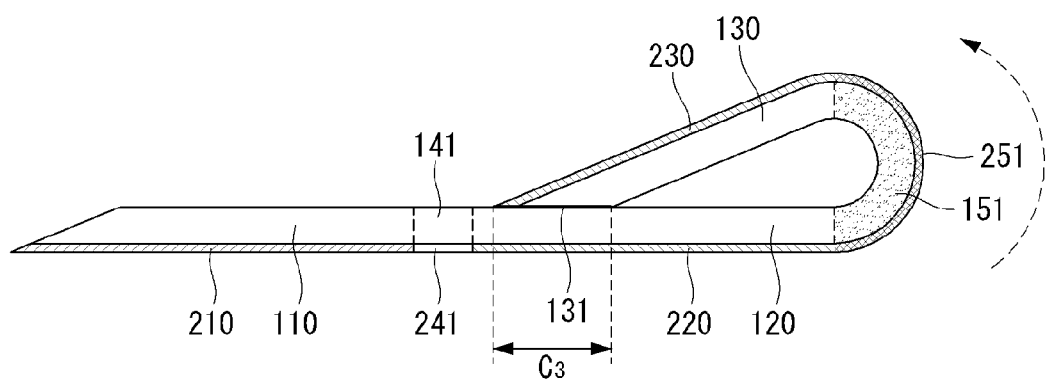

Referring to FIG. 5, as the third body 130 is rotated counterclockwise on the second bending portion 151, the sloping surface 131 formed on a cross-section of the third body 130 is attached to a predetermined region c3 of the second body 120.

The sloping surface 131 of the third body 130 and the predetermined region C3 of the second body 120 may be magnetically attracted to each other. That is, the sloping surface 111 and the predetermined region C3 of the second body 120 have the opposite polarity.

If the angle of counterclockwise rotation of the third body 130 by the elastic force of the first bending portion 141 exceeds a predetermined critical angle, the elastic force of the second bending portion 151 and the magnetic attraction between the sloping surface 131 and the predetermined region C3 of the second body 120 cause the sloping surface 131 to be attached to the predetermined region C3 of the second body 120.

By the way, when the sloping surface 131 is attached to the predetermined region C3 of the second body 120, the third body 130 and the second body 120 are not attached to each other. That is, the second bending portion 151 has a predetermined elastic force but maintains a predetermined shape by the rotation of the third body 130. Accordingly, a space exists between the third body 130 and the second body 120.

The position of the predetermined region C3 of the second body 120 to which the sloping surface 131 is attached may be the position which causes the second body 120 and the first body 110 to be in parallel when the first body 110 is rotated clockwise and is attached to a predetermined region (C4 of FIG. 6) of the third screen 310 supported by the third body 130.

Figure 6:
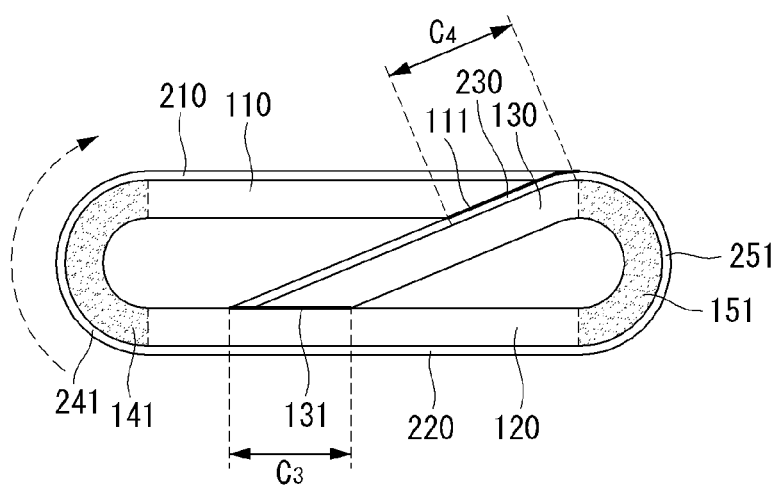

Afterwards, referring to FIG. 6, after the sloping surface 141 of the third body 130 is attached to the predetermined region C3 of the second body 120, the first body 110 may be rotated clockwise and be coupled to the third body 110.

More specifically, the sloping surface 111 of the first body 110 may be rotated clockwise on the first bending portion 141, and be attached to the predetermined region C4 of the third screen 310 supported by the third body 130.

As seen from FIGS. 3 to 6, owing to the fully symmetrical structure, the display device according to an embodiment of the present invention can be provided with the same full body screen regardless of which of the first body 110 and the third body 130 is rotated on the second body 120 first.

While the above description has been made with respect to the case in which the first body 110 and/or the third body 130 is rotated in a direction which causes the flexible display screen 200 to be exposed to the outside, the present invention is not limited to this case.

For instance, referring again to FIG. 1, the flexible display screen 200 may be disposed not on the front surface of the body 100 but on the rear surface thereof. In this case, the first body 110 and/or the third body 130 is sequentially rotated and folded, thereby causing the flexible display screen 200 to be blocked by the first body 110 and/or the third body 130.

The deformation of bending portions 140 and 150 provided at the body 100 by the rotation of the first body 110 and/or the third body 130 will be described below.

Figure 7:
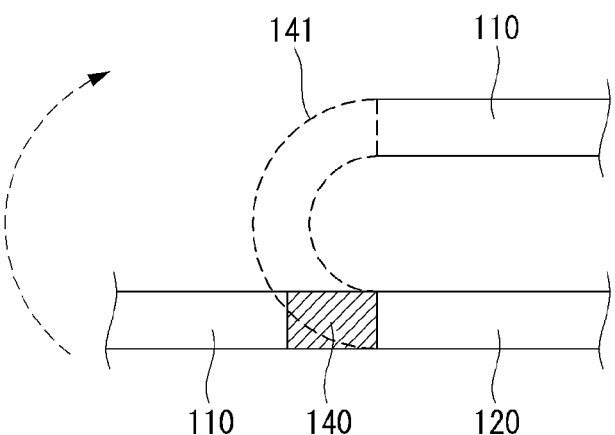
FIGS. 7 and 8 are views showing an example of shape deformation of bending portions upon rotation.
Figure 8:
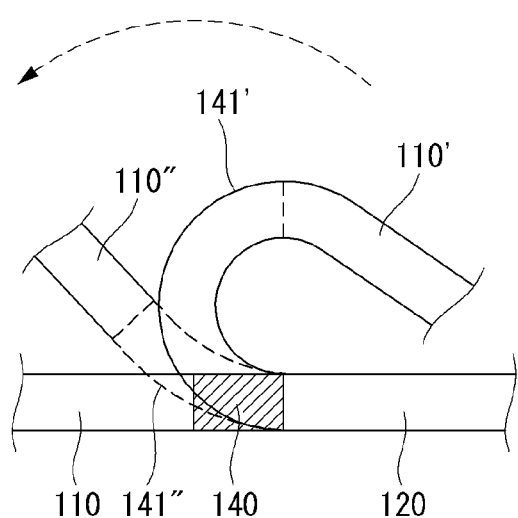

FIGS. 7 and 8 are views showing an example of shape deformation of bending portions upon rotation.

Referring to FIG. 7, the first bending portion 140 is positioned between the first body 110 and the second body 120.

As the first body 110 is rotated clockwise, the first bending portion 140 may be deformed in shape to a semicircular bending portion 141.

Referring to FIG. 8, with the first body 110 being deformed in shape to a semicircular bending portion 141' due to clockwise rotation, if the first body 110 is rotated counterclockwise, the semicircular bending portion 141' may return to the shape of the first bending portion 140 as its length is reduced. That is, the shape of the first bending portion 140 may be flexibly changed to 141' 141", and so on by the rotation of the first body 110.

Although not shown, it is needless to say that the shape of the second bending portion 150 also may be deformed by the rotation of the third body 130 as described above.

Figure 9:
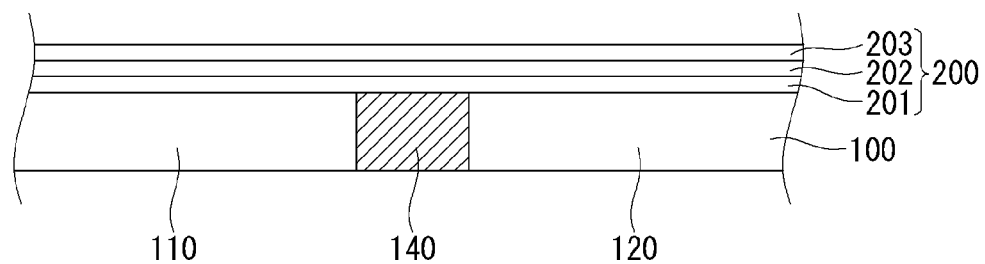
FIG. 9 is a view for explaining in detail a configuration of the display device according to an embodiment of the present invention.
Figure 10:
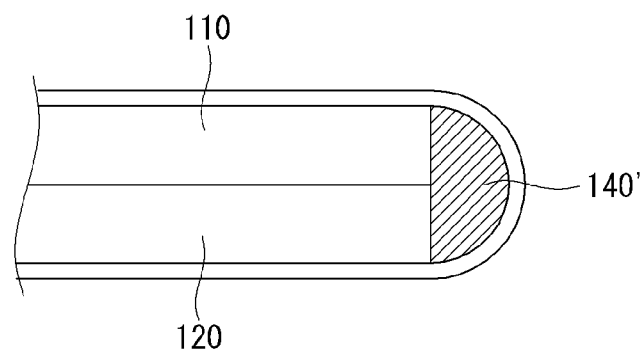
FIG. 10 is a view showing the display device shown in FIG. 9 being folded in a particular direction.

FIG. 9 is a view for explaining in detail a configuration of the display device according to an embodiment of the present invention. FIG. 10 is a view showing the display device shown in FIG. 9 being folded in a particular direction.

Referring to FIG. 9, the display device according to an embodiment of the present invention may comprise the body 100, a backlight unit layer 201 adjoining the body 100, a flexible display screen 202, and a touch layer 203.

Moreover, the body 100 may be provided with the first bending portion 140 between the first body 110 and the second body 120. Although not shown, the second bending portion 150 may be provided between the second body 120 and the third body 130, and the flexible display screen 200 may be supported by the first body 110, the first bending portion 140, the second body 120, the second bending portion 150, and the third body 130 to thus form a continuous screen.

Further, as the body 100 is bent by each of the bending portions 140 and 150, the flexible display screen 200 also may be bent.

Referring to FIG. 10, the second body 120 may be rotated clockwise on the first bending portion 140, and be coupled to the first body 110. In this case, the shape of the first bending portion 140 may be deformed from a rectangular shape to a semicircular shape, thus linking together the first body 110 and the second body 120 attached to each other.

The structure and shape of the first bending portion 140 may be deformed in various manners.

Figure 11:
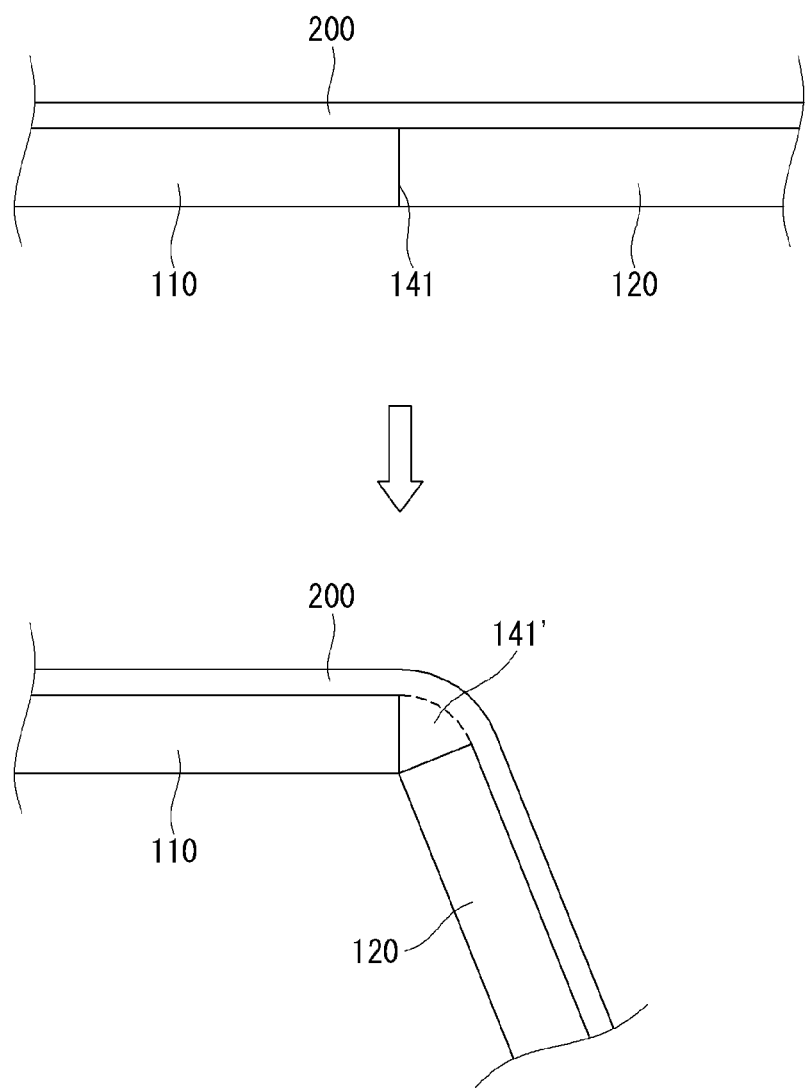
FIGS. 11 to 13 are views showing an exemplary shape of a bending portion when the display device according to an embodiment of the present invention is bent according to the configuration of the bending portion.
Figure 12:
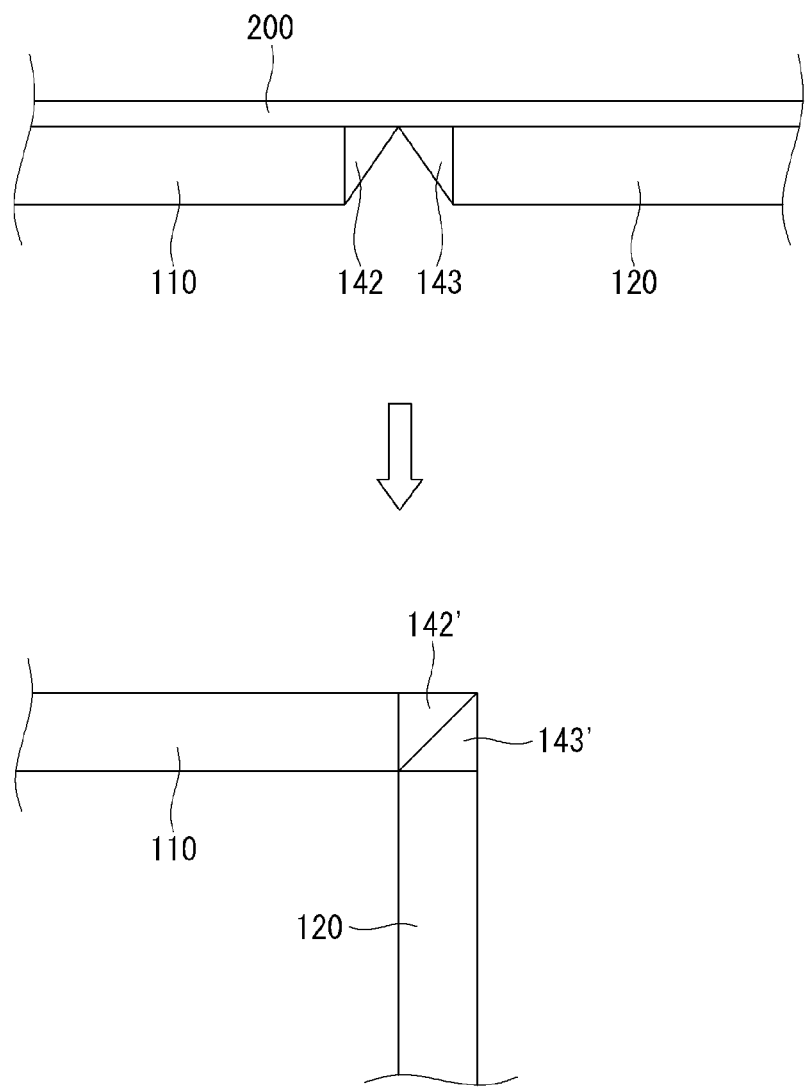
Figure 13:
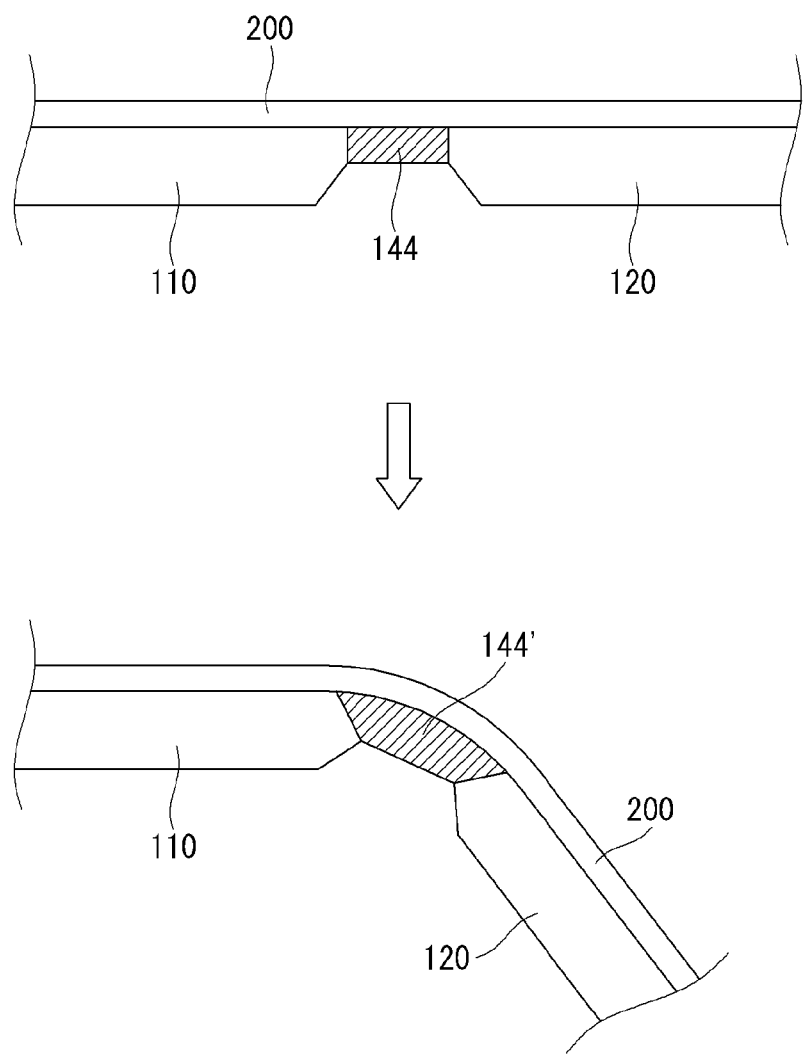

FIGS. 11 to 13 are views showing an exemplary shape of a bending portion when the display device according to an embodiment of the present invention is bent according to the configuration of the bending portion.

Referring to FIG. 11, the first bending portion 141 may be configured as a sliding type. If the second body 120 is rotated clockwise on the first bending portion 141, the first bending portion 141' may be deformed in shape as its upper end slides in a fan-like pattern. Moreover, the flexible display screen 200 may be folded as it slides together with sliding of the first bending portion 141.

Referring to FIG. 12, the first bending portion 140 may comprise a first block 141 and a second block 143. The first block 142 is attached to the first body 110, and the second block 143 is attached to the second body 120. The first block 142 and the second block 143 have a triangular shape, and the two blocks 142 and 143 may be connected at a vertex. Accordingly, if the second body 120 is rotated clockwise at 90°, a surface of the first block 142' and a surface of the second block 143' may overlap with each other.

Referring to FIG. 13, the first bending portion 140 may be formed as a flexible body 144. For example, the flexible body 144 may be provided between the first body 110 and the second body 120. If the second body 120 is rotated clockwise, the flexible body 144' is stretched in a predetermined direction, thus rendering the flexible display screen 200 foldable. The tensile strength of the flexible body 144' may vary from region to region, and the tension of a surface adjoining the flexible display screen 200 may be better than that of a surface not adjoining the flexible display screen 200.

The following description will be made on the attachment between body regions or between a body region and a flexible display screen region, which is achieved by bending the first body 110 and/or the third body 130, to form a full body screen.

Figure 14:
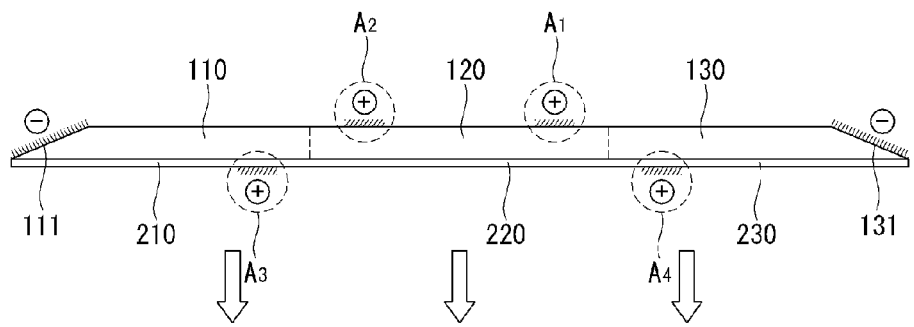
FIG. 14 is a view showing an example of a region applied with a magnetic property in the display device according to an embodiment of the present invention.

FIG. 14 is a view showing an example of a region applied with a magnetic property in the display device according to an embodiment of the present invention.

Referring to FIG. 14, predetermined regions of the flexible display screen 200 of the body 100 of the display device according to an embodiment of the present invention may be rendered magnetic.

For example, the sloping surface 111 of the first body 110 and the sloping surface 131 of the third body 130 may have a first polarity.

A predetermined region A1 of the second body to which the sloping surface 111 of the first body 110 is to be attached by clockwise rotation may have a second polarity opposite to the first polarity.

With the sloping surface 111 of the first body 110 being attached to the region A1, a region A3 of the first screen 110 to which the sloping surface 131 of the third body 130 having the first polarity is to be attached by counterclockwise rotation may have the second polarity (e.g., +polarity) opposite to the first polarity (e.g., −polarity).

Because the display device according to an embodiment of the present invention has a symmetrical structure, a region A3 of the second body to which the sloping surface 131 of the third body 130 having the first polarity (e.g., −polarity) is to be attached may have the second polarity (e.g., +polarity) by taking into account the case in which the third body 130 is rotated before the first body 110 is rotated.

Moreover, a region A4 of the third screen 230 to which the sloping surface 111 of the first body 110 having the first polarity (e.g., −polarity) is to be attached by counterclockwise rotation may have the second polarity (e.g., +polarity).

Hereinafter, the present invention will be described in more detail with reference to FIGS. 15a, 15b, 16a, and 16b.

FIGS. 15a to 16b are views showing an example of the regions applied with a magnetic property shown in FIG. 14 when the display device according to an embodiment of the present invention is in an open state.

Figure 15A:
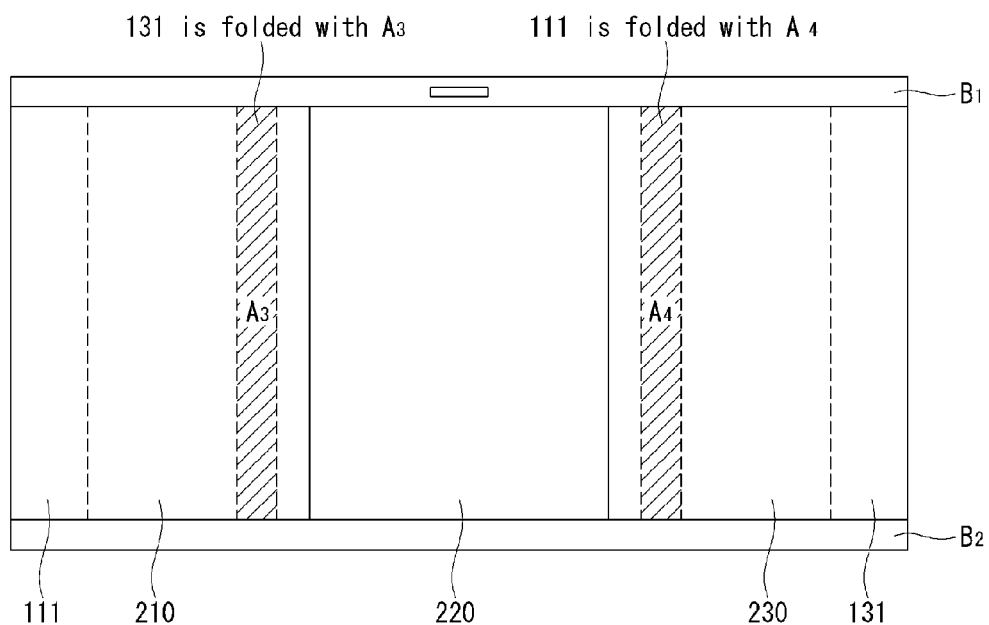
FIGS. 15a to 16b are views showing an example of the regions applied with a magnetic property shown in FIG. 14 when the display device according to an embodiment of the present invention is in an open state.

Referring to FIGS. 14 to 15a, when the display device according to an embodiment of the present invention is in an unfolded state, the first screen 210, the second screen 220, and the third screen 230 are exposed to the outside. Moreover, the display device may comprise predetermined bezel areas B1 and B2 formed on the upper and lower edges of the screen.

The region A3 of the first screen 210 is a region having the '+polarity', which may be coupled to the sloping surface 131 of the third body 130 based on attraction caused by a magnetic force.

Meanwhile, the display device according to an embodiment of the present invention is capable of selectively controlling the magnetic property of specific regions of the first screen 210 and the third screen 230 according to the structural characteristics of the display device.

For instance, a bending portion may comprise a bending sensor (not shown), and the bending sensor may detect the rotation of the first body 110. If the first body 110 is rotated clockwise, a controller (not shown) of the display device can control the display so that the region A3 of the first screen 210 has a specific magnetism.

If the first body 110 returns to the original state from the bent state, the bending sensor senses this, and the controller (not shown) of the display device controls the display to remove the polarity of the region A3 of the first screen 210.

In the case that a material having a predetermined magnetism exists on the first screen 210 and the third screen 230, distortion may be present in an image displayed through the first screen 210 and the third screen 230. Accordingly, if the flexible display screen 200 of the display device is fully unfolded, the first screen 210 and the third screen 230 do not need to be coupled to a specific body region by a magnetic force. Thus, it is preferable to remove the polarity of the region A3 and the region A4.

However, if the first screen 210 and the third screen 230 are rotated in respective predetermined directions to cause only the second screen 220 to face the front, and the other screens 210 and 230 are present on the rear or inside the body, the controller (not shown) of the display device can control the physical properties of the display so that the region A3 and the region 4 may have a predetermined magnetism.

Figure 15B:
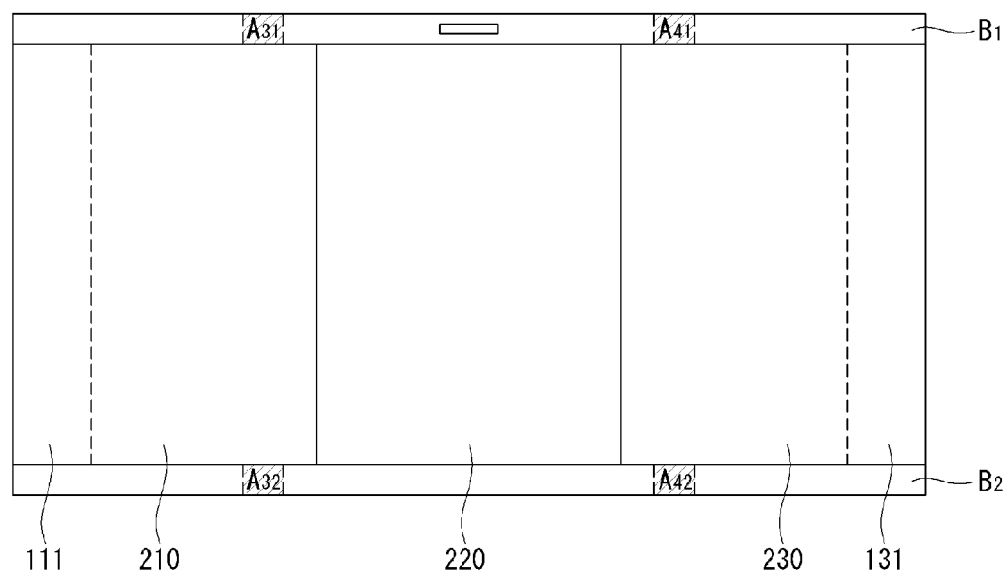

As shown in FIG. 15b, the magnetic regions on the flexible display screen 200 comprising the first screen 210, the second screen 220, and the third screen 230 may be not the first screen 210 and/or third screen 230, but the bezel areas B1 and B2 of the flexible display screen 200.

For example, referring to FIG. 15b, magnetism of a predetermined polarity may be applied to regions A31, A32, A41, and A42, and the region A31 and/or the region A32 may be magnetically coupled to the sloping surface of the third body 130 by the rotation of the third body 130. The region A41 and/or the region A42 may be magnetically coupled to the sloping surface 111 of the first body 111 by the rotation of the first body 110.

Figure 16A:
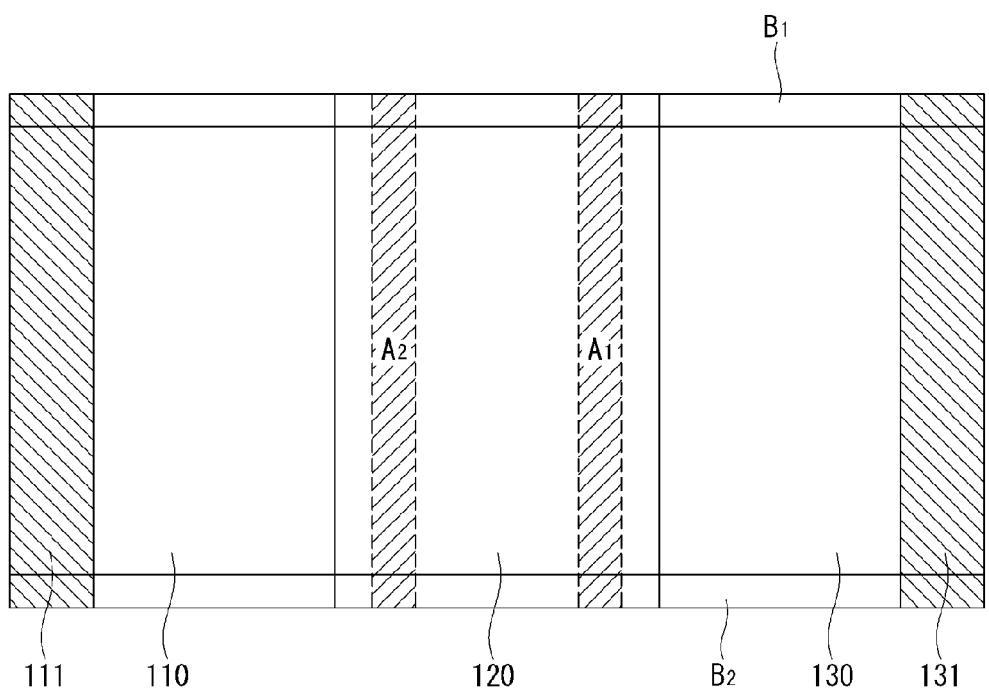

FIG. 16a shows the body 100 supporting the flexible display screen 200.

Referring to FIG. 16a, the sloping surface 111 of the first body 110 and the sloping surface 131 of the third body 130 each may have the first polarity (e.g., polarity). Also, the regions A1 and A2 of the second body 120 to be coupled to the sloping surfaces 111 and 131 by rotation may have the second polarity (e.g., +polarity) opposite to the first polarity.

As described above, the regions in which the sloping surface 111 of the first body and the sloping surface 131 of the third body have the first polarity (e.g., −polarity) may be the entire regions of the sloping surfaces 111 and 131, or alternately may be limited to the bezel areas 111a, 111b, 131a, and 131b.

Figure 16B:
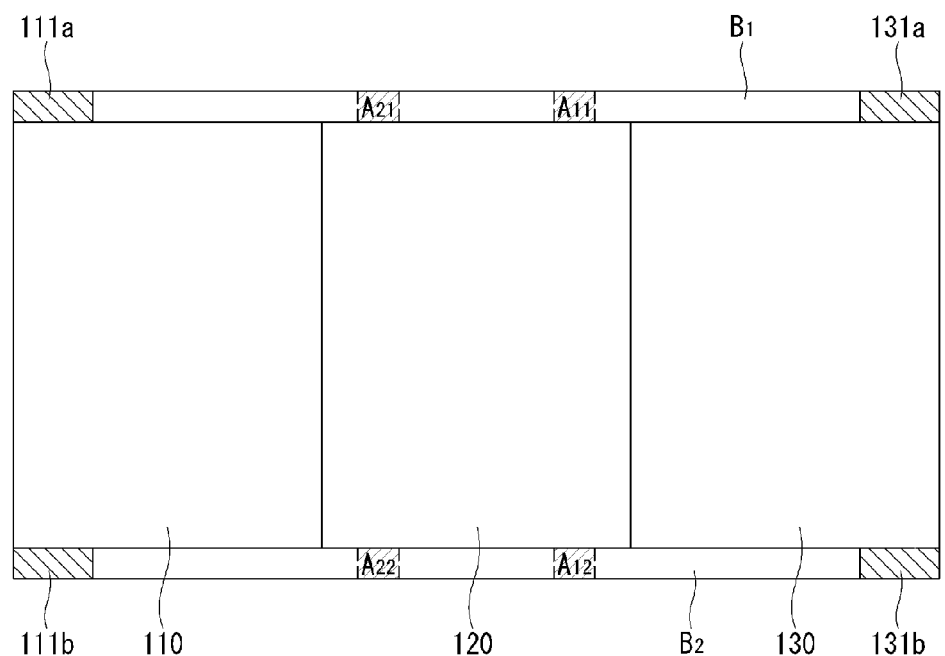

Referring to FIG. 16b, the regions A1 and A2 of the second body 120 to be coupled to the sloping surfaces 111 and 131 by rotation may have the second polarity (e.g., +polarity) opposite to the first polarity.

The regions of the second body 120 magnetically coupled to the bezel areas 111a and 111b having the first polarity (e.g., −polarity) also may be limited to A21, A22, A11, and A12.

Accordingly, in the display device according to an embodiment of the present invention, the regions magnetically coupled by the rotation of the first body 110 and the third body 130 may be part of the bezel areas A21, A22, A11, and A12.

Figure 17:
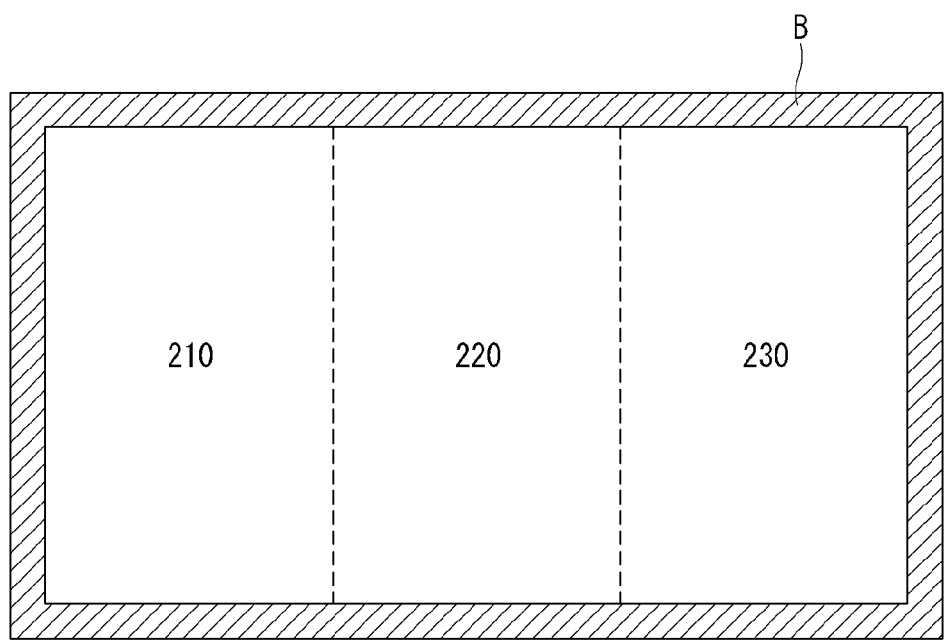
FIG. 17 is a view showing another example of a bezel structure of the display device according to an embodiment of the present invention.

FIG. 17 is a view showing another example of a bezel structure of the display device according to an embodiment of the present invention.

Although the display device referred in FIGS. 15 and 16 comprises bezel areas B1 and B2 formed on the upper and lower edges of the flexible display screen 200, the present invention is not limited thereto.

For example, as shown in FIG. 17, the flexible display screen 210, 220, and 230 may comprise a bezel area B formed on the upper edge, lower edge, left edge, and right edge.

A predetermined region of the bezel area B may comprise a predetermined magnetism so as to be magnetically coupled by the rotation of the first screen 210 and/or third screen 230. Further, the magnetic characteristic of the predetermined region of the bezel area B may be controlled so as to have a predetermined magnetic property depending on the amount of rotation of the first screen 210 and/or the third screen 230.

Figure 18:
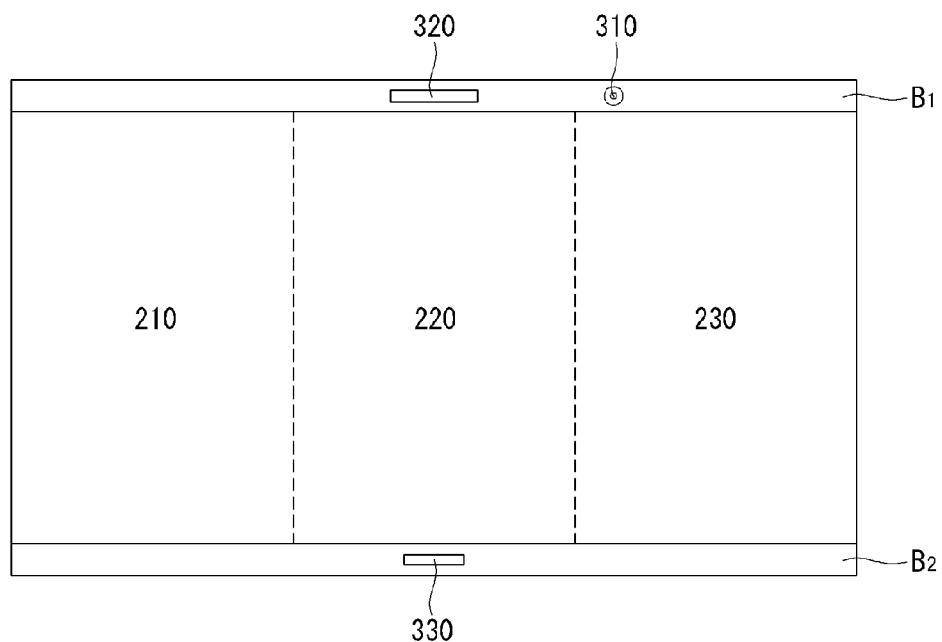
FIG. 18 is a view showing an example of the display device according to an embodiment of the present invention in an open state.
Figure 19:
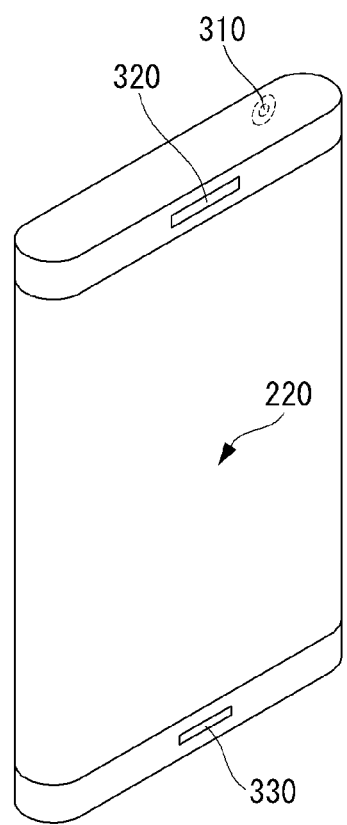
FIGS. 19 and 20 are views showing an example of the display device according to an embodiment of the present invention in a closed state.
Figure 20:
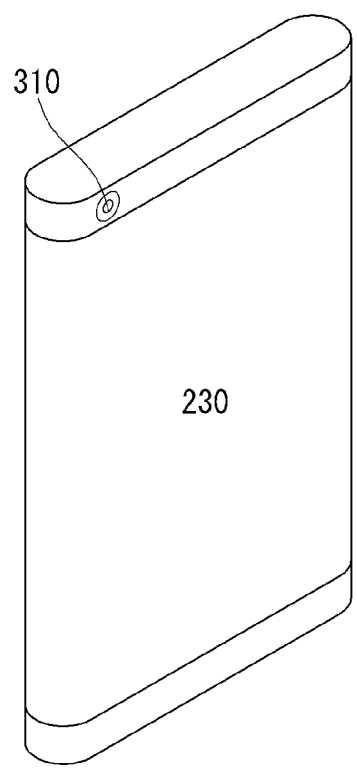

FIG. 18 is a view showing an example of the display device according to an embodiment of the present invention in an open state. FIGS. 19 and 20 are views showing an example of the display device according to an embodiment of the present invention in a closed state.

Referring to FIG. 18, the display device may comprise a camera module 310 on any of the first body 110 and the third body 130.

The display device may comprise a speaker 320 and a microphone 330 on the second body 120.

The camera module 310 may be provided in a corresponding bezel area B1 of the third body 130, and the speaker 320 and the microphone 330 each may be provided in a corresponding bezel area B2 of the second body 120.

The camera module 310 may be used as a front camera or rear camera according to the structural characteristics of the display device.

For instance, as shown in FIG. 18, when the flexible display screen 200 is fully unfolded, the camera module 310 disposed in a specific one of the bezel areas of the screen supported by the third body 130 may be used as the front camera.

Moreover, for instance, referring to FIGS. 19 and 20, only the second screen 220 of the flexibly display screen 200 may be exposed to the front, the third screen 230 may be exposed to the rear, and the first screen 210 may be exposed to neither the front nor the rear. In this case, the camera module 310 provided in the corresponding bezel area of the third screen 230 may be used as the rear camera.

That is, in accordance with an implemented embodiment, if only the second screen 220 is exposed to the front, the display device may operate in the cellular phone mode (first mode). Moreover, if all of the first screen 210, the second screen 220, and the third screen 230 are exposed to the front, the display device may operate in the smart pad mode (second mode).

Meanwhile, in the case that the display device according to an embodiment of the present invention is in any of the first and second modes, the power of the screen can be controlled according to the mode.

Figure 21:
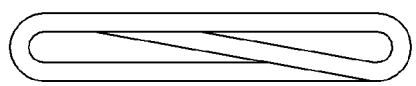
FIGS. 21 and 22 are views for explaining an example of controlling the power of a display unit depending on whether the display device according to an embodiment of the present invention is opened or closed.
Figure 21:
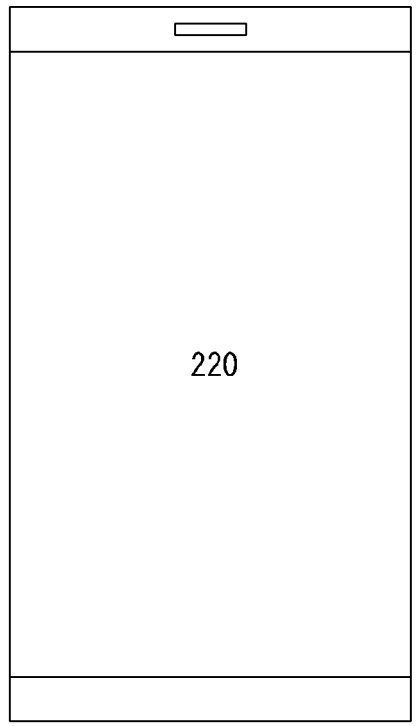
Figure 22:
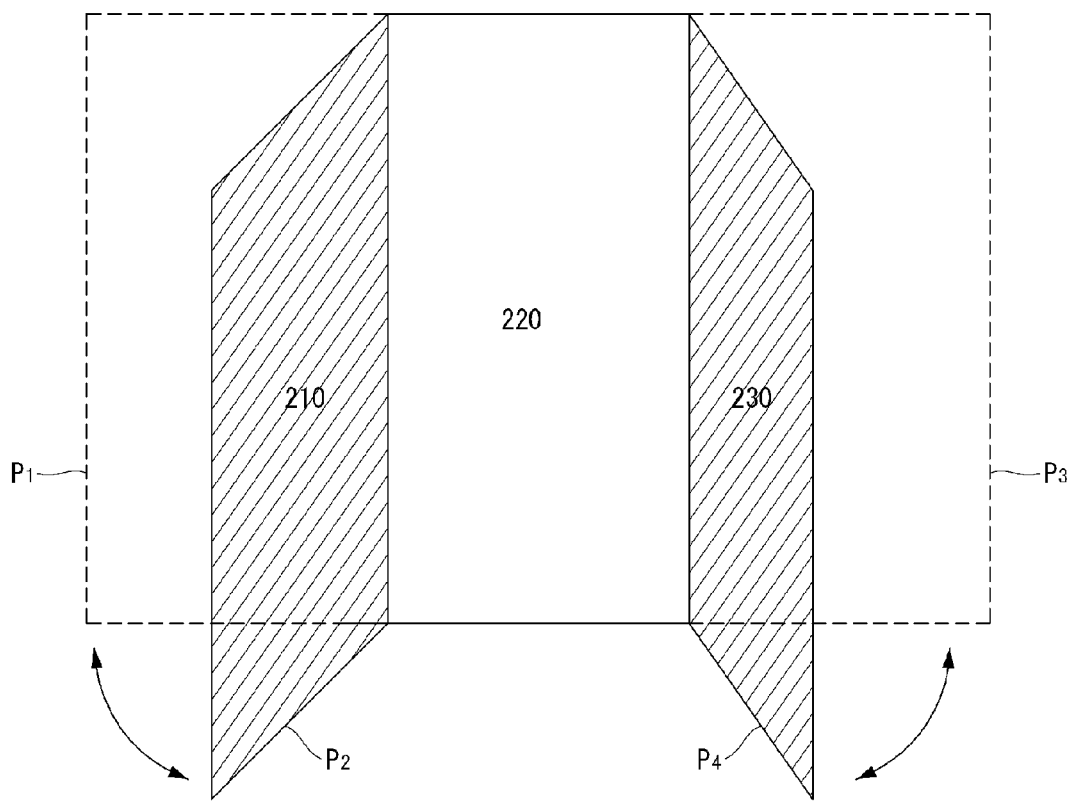

FIGS. 21 and 22 are views for explaining an example of controlling the power of a display unit depending on whether the display device according to an embodiment of the present invention is opened or closed.

Referring to FIG. 21, the bending sensor (not shown) is able to sense a bent state of the first body 110 and/or the third body 120. Then, the controller (not shown) of the display device recognizes that the display device operates in the first mode, and powers on only the second screen 220 exposed to the front and powers off the first screen 210 and the third screen 230.

Referring to FIG. 22, if the first screen 210 is at a position P1, the power is in the on state. However, as the first screen 210 is bent at the position P1 in a direction P2, the controller (not shown) can cut off the power supply of the first screen 210.

Likewise, as the third screen 230 is bent at a position P3 in a direction P4, the controller (not shown) can cut off the power supply of the third screen 230.

Accordingly, power consumption can be reduced, with the structural characteristics and use of the display device taken into account.

In the display device according to an embodiment of the present invention, the first body 110, the second body 120, and the third body 130 have the same length. Also, the first screen 210, the second screen 220, and the third screen 230 are equally divided from each other. The following description will be made about an example of equally dividing the bodies or screens.

Figure 23:
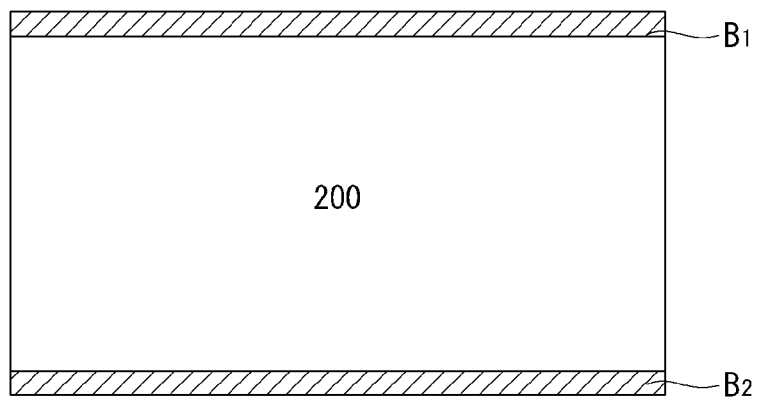
FIGS. 23 and 24 are views for explaining an example of equally dividing the flexible display screen in accordance with the bezel structure of the display device according to an embodiment of the present invention.
Figure 23:
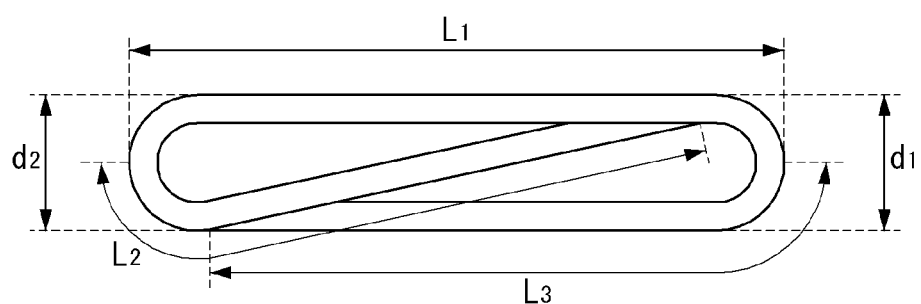
Figure 24:
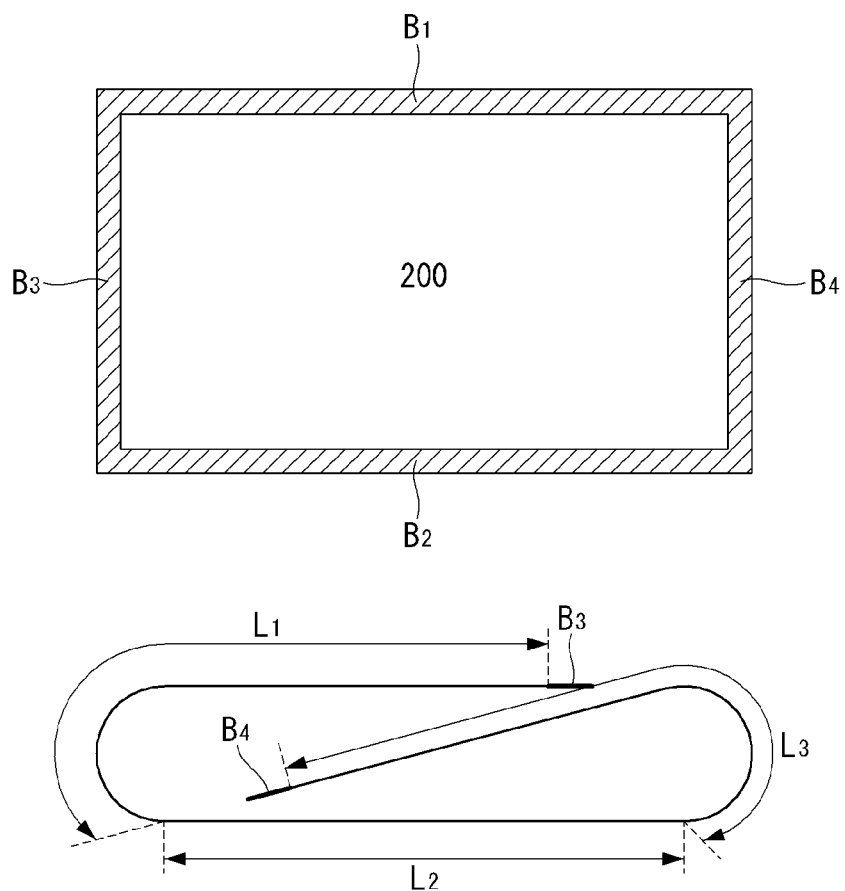

FIGS. 23 and 24 are views for explaining an example of equally dividing the flexible display screen in accordance with the bezel structure of the display device according to an embodiment of the present invention.

Referring to FIG. 23, the flexible display screen 200 of the display device may comprise bezel areas B1 and B2 on the upper and lower edges.

If both of the first body and the third body are rotated and folded, the length L1, L2, and L3 of each body is equal as seen from FIG. 23. Moreover, the height or thickness d1 and d2 formed by folding each body is equal, too.

Referring to FIG. 24, the upper edge, lower edge, left edge, and right edge of the flexible display screen 200 of the display device are all surrounded by the bezel areas B, B2, B3, and B4.

In this case, if both of the first body and the third body are rotated and folded, L1, L2, and L3, which do not include the length of the bezel area B3 of the right edge and the length of the bezel area B4 of the right edge, are equal to each other.

Figure 25:
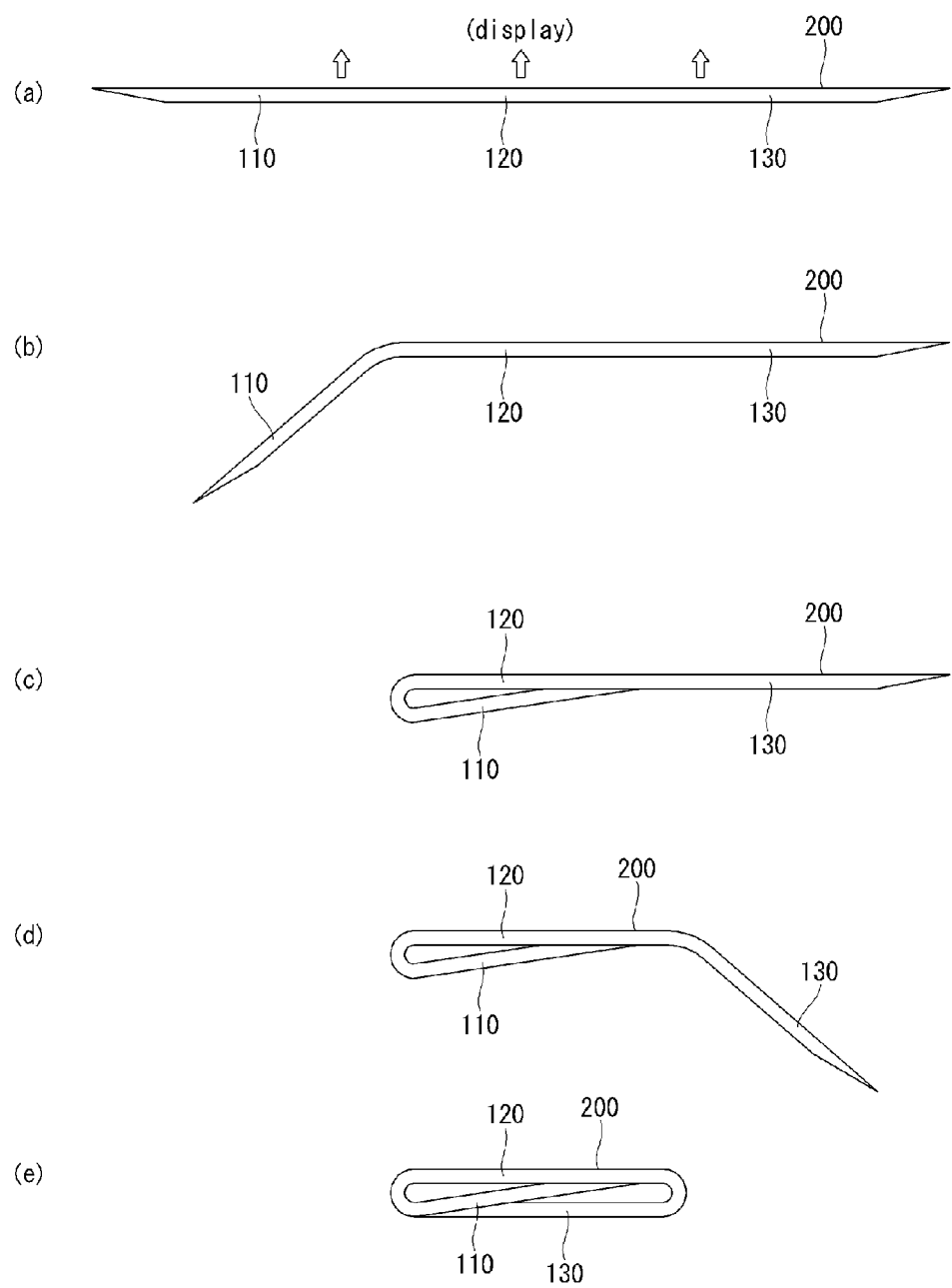
FIGS. 25 and 26 are views exemplifying the order of folding the display device according to an embodiment of the present invention.
Figure 26:
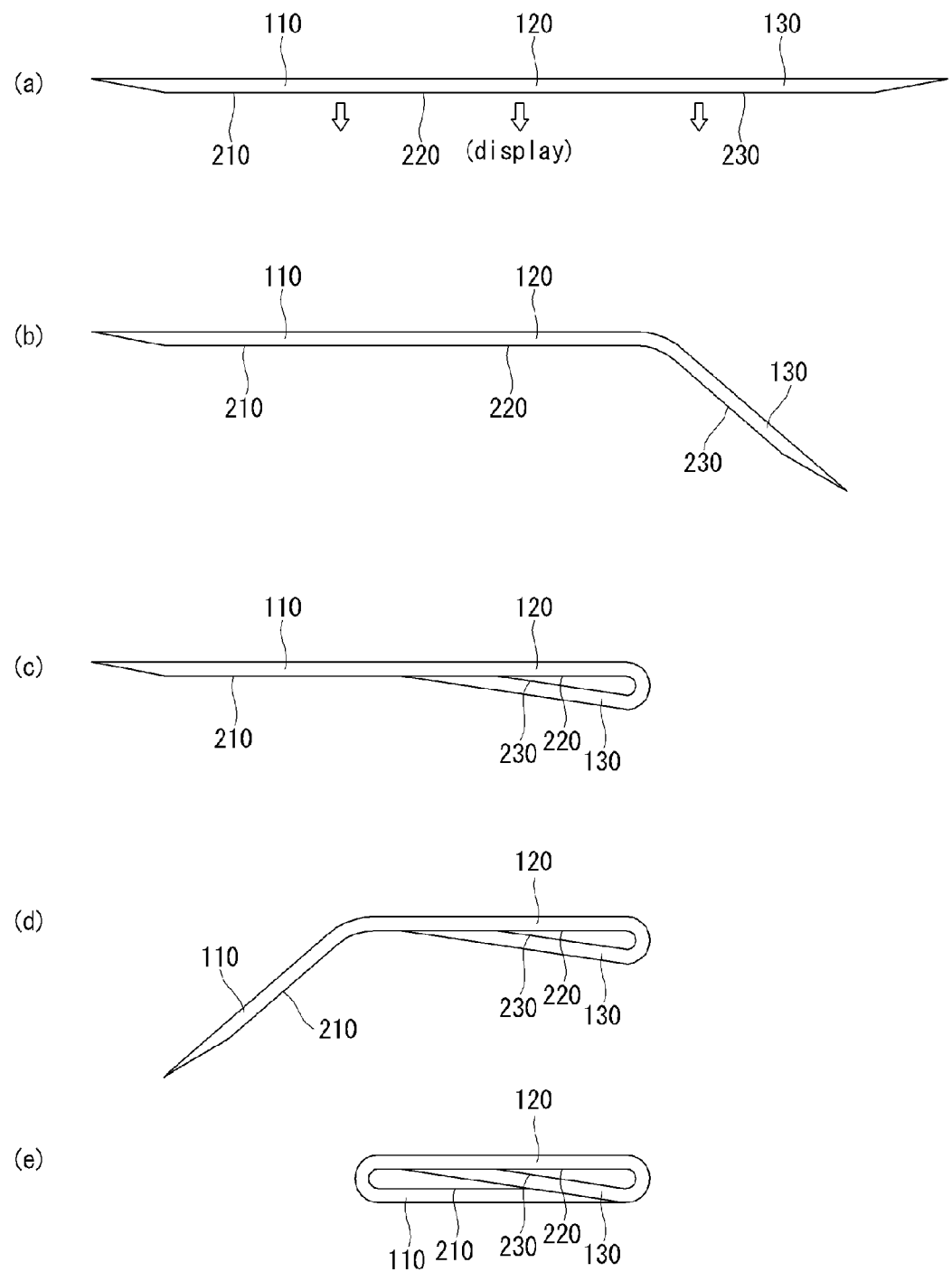

FIGS. 25 and 26 are views exemplifying the order of folding the display device according to an embodiment of the present invention.

Referring to FIG. 25, in the display device, when the flexible display screen 200 and the body 100 supporting the flexible display screen 200 are unfolded (a), the first body 110 is rotated counterclockwise and is connected to the second body (b). Afterwards, the third body 130 is rotated clockwise (c) and is connected to the first body 110 connected to the second body 120(d).

Accordingly, all the screens are exposed to the outside, thereby realizing a full body screen. That is, the first body 110 and the third body 130 are configured to be rotated so as to expose the flexible display screen 200 to the outside.

However, as discussed above, the display device according to an embodiment of the present invention may be implemented in such a manner that none of the screens are exposed to the outside upon rotation of the first body and the third body.

Referring to FIG. 26, in the display device according to an embodiment of the present invention, the first body 110, the second body 120, and the third body 130 may be sequentially connected to each other, and the first bending portion 140 may be provided between the first body 110 and the second body 120, and the second bending portion 150 may be provided between the second body 120 and the third body 130(a).

The flexible display screen 200 may comprise the first screen 210 supported by the first body 110 and comprising a sloping surface on a cross-section of the first body 110, the second screen 220 supported by the second body 120, and the third screen 230 supported by the third body 130 and comprising a sloping surface on a cross-section of the third body 130.

The first screen 210, the second screen 220, and the third screen 230 may form a continuous screen.

By clockwise rotation of the third body 130(b), the sloping surface of the third screen 230 may be attached to the first screen 210(c).

Thereafter, by counterclockwise rotation of the first body 110(d), the first body 110 may be attached to the third body 230 supporting the third screen 230 attached to the first screen 210(e).

Accordingly, the entire parts of the flexible display screen 200 are not exposed to the outside, but only the bodies are exposed to the outside.

In this way, once the first body 110 and the third body 130 are folded in such a manner that the flexible display screen 200 is not exposed to the outside, the display device according to an embodiment of the present invention can operate the flexible display screen 200 in three modes.

For example, the body may have an open configuration that exposes all of the first screen 210, the second screen 220, and the third screen 230 to the outside.

Alternatively, the body may have a partially closed configuration that exposes only the third screen to the outside as the first body 110 is rotated to attach the sloping surface of the first screen to the second screen.

Alternatively, the body may have a closed configuration that exposes none of the first to third screens to the outside as the third body 130 is rotated to attach the sloping surface of the third screen 230 to the first body when the sloping surface of the first screen 210 is attached to the second screen 220 by the rotation of the first body 110.

Although the flexible display screen explained with reference to FIG. 26 has been described to comprise a sloping surface, the sloping surface may correspond to a body, and the flexible display screen may be composed of a flat panel with no sloping surface.

Figure 27:
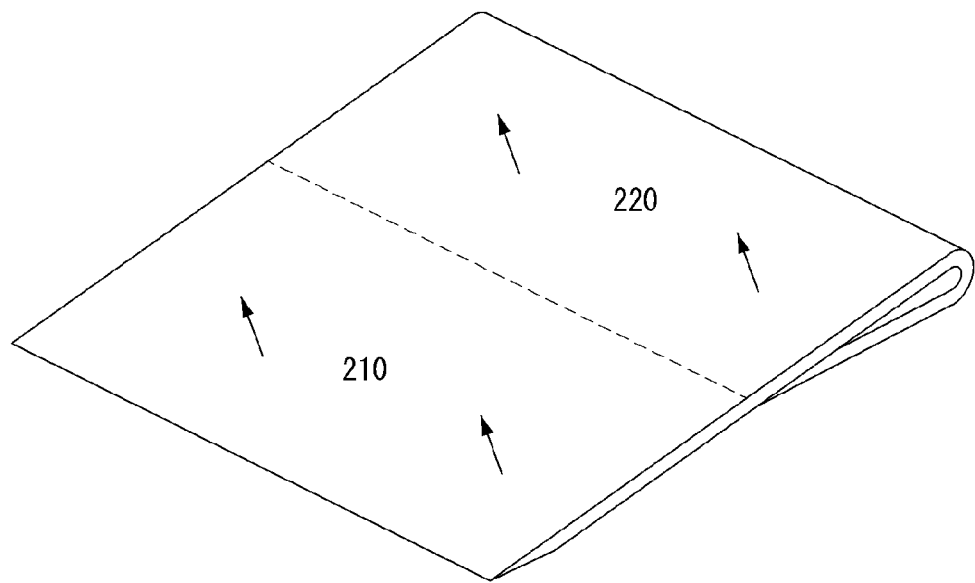
FIGS. 27 to 29 are views for explaining various uses of the display device according to an embodiment of the present invention.
Figure 28:
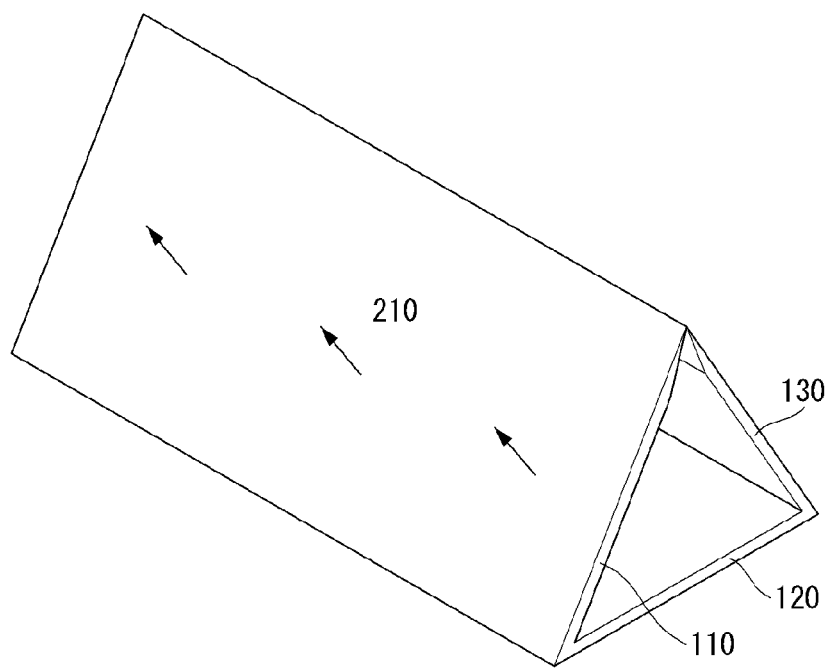
Figure 29:
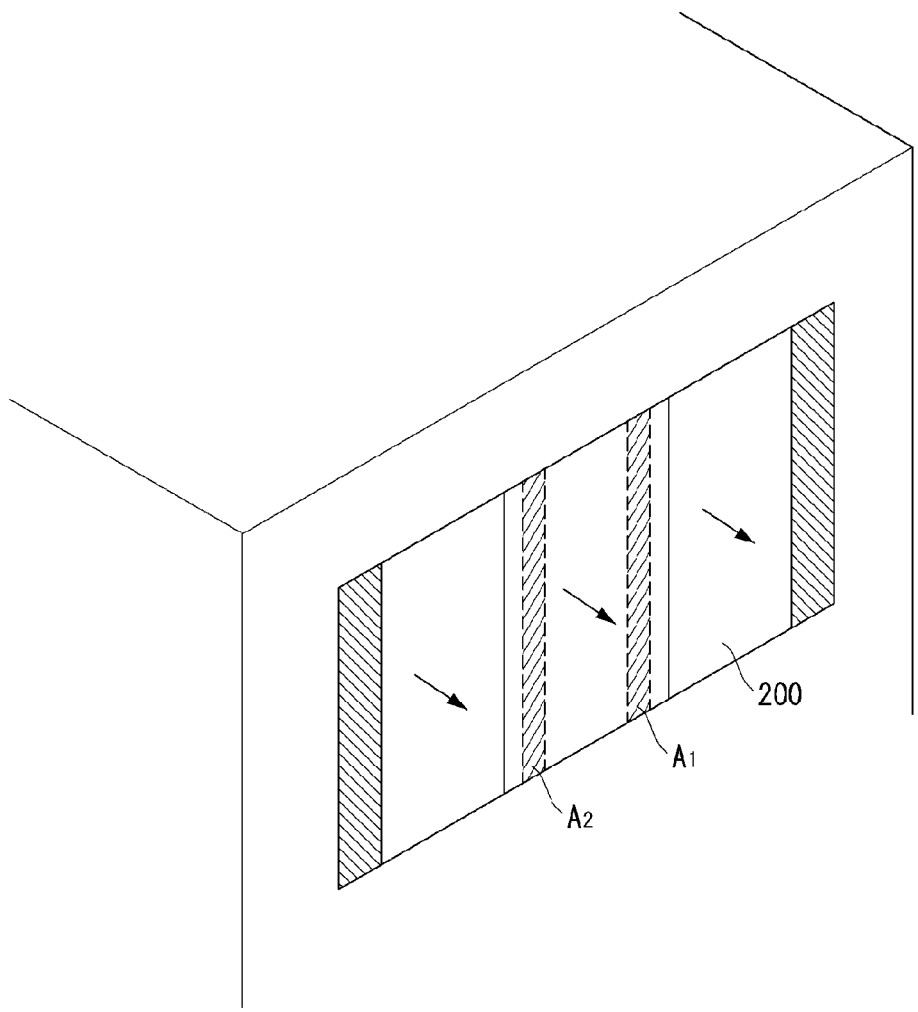

FIGS. 27 to 29 are views for explaining various uses of the display device according to an embodiment of the present invention.

Referring to FIG. 27, the first screen 210 and the second screen 220 can be used when only the third body 130 is rotated and folded. Also, it is convenient to use the first screen 210 and the second screen 220 because of a slope of the folded third body 130.

Referring to FIG. 28, unlike the aforementioned examples, the first body 110 and the third body 130 can be connected together. More specifically, it is possible to use the first screen 210 and the third screen 230 by connecting the corner of the sloping surface of the first body 100 and the corner of the sloping surface of the third body 131. In this case, the display device itself can be used as a holder.

Referring to FIG. 29, as shown in FIG. 16, the regions A1 and A2, among the regions of the body 100 on the rear, are regions having a predetermined magnetism when the entire parts of the flexible display screen 200 is unfolded. This allows the display device to be easily attached to an external magnetic object.

The above-described method of controlling a mobile terminal according to the present invention can be recorded in a computer-readable medium as a program to be executed in a computer.

The method of controlling a mobile terminal according to the present invention can be executed by software. When executed by software, constituting means of the present invention correspond to code segments carrying out necessary tasks. Programs or code segments can be stored in a processor-readable medium or transferred by a transfer medium or computer data signals combined with carrier waves through a communication network.

The computer readable recording medium includes all types of recording devices storing data readable by computer systems. Examples of the computer readable recording medium include ROM, RAM, CD-ROM, DVD±ROM, DVD-RAM, magnetic tapes, floppy disks, hard disks, and optical data storage devices. The computer readable recording medium can also be distributed over network coupled computer systems so that the computer readable code is stored and executed in a distributed fashion.

The present invention described above is not limited to the aforementioned embodiments and the accompanying drawings. It will be apparent that those skilled in the art can make various substitutions, modifications and changes thereto without departing from the technical spirit of the present invention. Further, the embodiments described in this document are not limitative, and all or some of the embodiments may be selectively combined so that they can be modified in various manners.

What is claimed is:

1. A display device comprising:
a body comprising a first body with a first sloping end, a second body, and a third body with a second sloping end, the first, second and third bodies being sequentially connected to each other; and
a flexible display screen supported by the first body, the second body, and the third body to form a continuous screen,
wherein a first edge portion of the flexible display screen is supported by the first sloping end, and a second edge portion of the flexible display screen is supported by the second sloping end,
wherein the body comprises a first bending portion which is provided between the first body and the second body and allows the first sloping end to be rotated on the first bending portion and to be attached to a predetermined region of the second body by a rotation of the first body, and
wherein the body further comprises a second bending portion which is provided between the second body and the third body and allows the second sloping end to be rotated on the second bending portion and to be attached to a predetermined region of the flexible display screen supported by the first body by a rotation of the third body when the first sloping end of the first body is attached to the predetermined region of the second body.

2. The display device of claim 1, wherein a rotation direction of the first body and the third body is a rotation direction that causes the flexible display screen to be exposed to the outside by rotation.

3. The display device of claim 2, wherein the predetermined region is a region that causes the second body and the third body to be in parallel.

4. The display device of claim 1, wherein the flexible display screen comprises:
a first screen supported by the first body;
a second screen supported by the second body; and
a third screen supported by the third body.

5. The display device of claim 4, further comprising a display controller for controlling a power supply of the first screen, the second screen and the third screen,
wherein the display controller powers off the first screen if the first body is rotated to attach the first sloping end of the first body to the predetermined region of the second body.

6. The display device of claim 5, wherein the display controller powers off the third screen if the third body is rotated to attach the second sloping end of the third body to the predetermined region of the first screen.

7. The display device of claim 1, wherein the predetermined region of the second body comprises a predetermined magnetic region, and
the first sloping end of the first body is magnetically coupled and attached to the predetermined magnetic region of the second body.

8. The display device of claim 7, wherein the predetermined region of the flexible display screen supported by the first body comprises a predetermined magnetic region, and
the second sloping end of the third body is magnetically coupled and attached to the predetermined magnetic region of the flexible display screen supported by the first body.

9. The display device of claim 8, wherein the flexible display screen supported by the first body comprises at least some bezel areas, and
the predetermined magnetic region of the flexible display screen supported by the first body is at least part of the bezel areas.

10. The display device of claim 1, wherein the first body, the second body, and the third body have the same length.

11. The display device of claim 1, further comprising a camera module provided in a bezel area of the flexible display screen supported by the third body.

12. The display device of claim 1, wherein the flexible display screen is a flexible organic light emitting diode FOLED.

13. The display device of claim 1, wherein the first body includes a first sloping surface formed on a side of the first body opposite to the flexible display screen, and the third body includes a second sloping surface formed on a side of the third body opposite to the flexible display screen.

14. The display device of claim 1, wherein the second body is in parallel with the third body, when the first sloping end is attached to the predetermined region of the second body, and the second sloping end is attached to the predetermined region of the flexible display screen supported by the first body.

15. The display device of claim 1, wherein a first hollow space is formed between the first body and the second body, and a second hollow space is formed between the first body and the third body, when the first sloping end is attached to the predetermined region of the second body, and the second sloping end is attached to the predetermined region of the screen supported by the first body.

16. A display device comprising:
a body with at least one bending portion; and
a flexible display screen which is disposed on a front of the body, supported by the body, and longer than the body,
wherein the body comprises sloping bodies which extend from both ends of the body to both edges of the flexible display screen,
wherein a first sloping body among the sloping bodies is rotated on a first bending portion and attached to a predetermined region of the body, and a second sloping body among the sloping bodies is rotated on a second bending portion and attached to a predetermined region of the flexible display screen, wherein a first edge portion of the flexible display screen is supported by the first sloping body, and a second edge portion of the flexible display screen is supported by the second sloping body, and wherein the first sloping body includes a first sloping surface formed at a distal first end of the body, and the second sloping body includes a second sloping surface formed at a second distal end of the body.

17. The display device of claim 16, wherein the body is equally divided by the first bending portion and the second bending portion.

18. The display device of claim 16, wherein the first sloping body and the second sloping body have a first magnetism.

19. The display device of claim 18, wherein the predetermined region of the body and the predetermined region of the flexible display screen have a second magnetism having a polarity opposite to that of the first magnetism.

20. A display device comprising:
   a body comprising a first body, a second body, and a third body sequentially connected to each other; and
   a flexible display screen which comprises a first screen supported by the first body and comprising a first sloping end, a second screen supported by the second body, and a third screen supported by the third body and comprising a second sloping end, wherein the first screen, the second screen, and the third screen form the flexible display screen as a continuous screen, wherein the body comprises a first bending portion which allows the first sloping end of the first screen to be rotated on the first bending portion and to be attached to a predetermined region the second screen by a rotation of the first body, wherein the body further comprises a second bending portion which allows the second sloping end of the third screen to be attached to the first body by a rotation of the third body, and wherein the first sloping end includes a first sloping surface formed at a distal end of the first screen, and the second sloping end includes a second sloping surface formed at a distal end of the third screen.

21. The display device of claim 20, wherein the body has any one of the followings:
   an open configuration that exposes all of the first screen, the second screen, and the third screen to the outside;
   a partially closed configuration that exposes only the third screen to the outside as the first body is rotated to attach the first sloping end of the first screen to the second screen; and
   a closed configuration that exposes none of the first to third screens to the outside as the third body is rotated to attach the second sloping end of the third screen to the first body when the first sloping end of the first screen is attached to the second screen by the rotation of the first body.

* * * * *